(12) United States Patent
Premakanthan et al.

(10) Patent No.: US 7,215,972 B2
(45) Date of Patent: May 8, 2007

(54) ADAPTIVE TRANSMIT POWER CONTROL SYSTEM

(75) Inventors: Pravinkumar Premakanthan, Boyton Beach, FL (US); Mahibur Rahman, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 317 days.

(21) Appl. No.: 10/731,069

(22) Filed: Dec. 9, 2003

(65) Prior Publication Data
US 2005/0122166 A1 Jun. 9, 2005

(51) Int. Cl.
*H04Q 7/20* (2006.01)
*H04B 7/00* (2006.01)
*H04B 1/04* (2006.01)

(52) U.S. Cl. ............... 455/522; 455/69; 455/127.1; 370/310; 370/311

(58) Field of Classification Search ........... 455/522, 455/69, 127.1, 234.1, 236.1, 245.1, 127.5, 455/572, 126; 370/311, 310
See application file for complete search history.

(56) References Cited

U.S. PATENT DOCUMENTS

| 5,278,994 | A | 1/1994 | Black et al. |
| 6,160,449 | A | 12/2000 | Klomsdorf et al. |
| 6,166,598 | A | 12/2000 | Schlueter |
| 2003/0040343 | A1* | 2/2003 | Epperson et al. ........... 455/572 |
| 2004/0102207 | A1* | 5/2004 | Wenzel et al. ............. 455/522 |
| 2004/0198270 | A1* | 10/2004 | Rozenblit et al. .......... 455/126 |

* cited by examiner

Primary Examiner—Tilahun Gesesse

(57) ABSTRACT

An adaptive closed loop transmit power control system which does not require extensive factory calibration of power control loop bandwidths and feedback detect path gain settings over the power transition ranges, frequency bands of operation, temperature, and supply voltage is disclosed. The system automatically compensates for any gain or slope variations in the analog feedforward and feedback paths to maintain system stability and meet performance specifications. The system achieves this by using an adaptive digital signal processing (DSP) system architecture within the feedback path of this closed loop power control system. The system eliminates the need for extensive factory calibration of such parameters as loop bandwidths and feedback detect path gain settings over power transition ranges, frequency bands of operation, temperature, and supply voltage.

29 Claims, 4 Drawing Sheets

ADAPTIVE TRANSMIT POWER CONTROL SYSTEM

BACKGROUND

1. Field of the Disclosure

The present disclosure relates to power control systems, and more particularly to adaptive power control systems that do not require factory calibration of loop control parameters.

2. Description of the Related Art

In current power control systems, transmit (Tx) power ramp up and down curves are controlled by altering the control or bias voltage applied to a power amplifier or a voltage controlled amplifier (VCA) modulator integrated circuit. For example, the controls to meet power control specification requirements, such as power versus time and transient adjacent channel power masks for GSM-FracN, WCDMA, and Cartesian IQ multiple access modes, are typically performed by a closed loop power control system.

Current closed loop power control systems require extensive factory calibration because the control voltage applied versus the transmit power output characteristics of the power amplifier or VCA stage as well as that of the power detection feedback path vary depending on the frequency band of operation, the input power level to the power amplifier, and variations in temperature and battery voltage.

Because of tri-band requirements (GSM, DCS or the PCS bands) of some systems, the slope of the control voltage versus the transmit power out characteristics changes with each frequency band of operation. In addition, the power amplifier transmit power versus the detected power characteristics of the power detector also vary with the different bands of operation.

The slope of the control voltage versus transmit power output curve varies with respect to input power levels (dBm) at the power amplifier. Prediction of variations of the power input to the power amplifier and programming of corresponding system parameters is difficult. The slope of control voltage versus the transmit power output curve also changes with temperature and battery voltage variations.

In order to meet loop stability and performance requirements including power versus time mask and switching transient specifications, different AOC system parameters, for example, loop bandwidths and the analog feedback gains, have to be programmed for each frequency band of operation, for different power inputs, and for different temperature and battery voltage variations. Typically, pre-calibrated fixed settings for the loop bandwidths during transmit ramp up and ramp down are used. The factory calibration of the power control loop bandwidths is a complex task which has to be performed as a function of the frequency band of operation, input power levels to the power amplifier, initial and final target power level, temperature, and supply voltage. Factory calibration is time intensive and costly.

A transmit power control system which does not need extensive factory calibration of power control loop bandwidths over the power transition ranges, frequency bands of operation, temperature and supply voltage is desired.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

An adaptive transmit power control system which does not require extensive factory calibration of power control loop bandwidths over the power transition ranges, frequency bands of operation, temperature, and supply voltage is disclosed. The system automatically compensates for any gain or slope variations in the power control feedforward path as well as in the power detect feedback path to maintain system stability and meet desired performance specifications. The system includes an adaptive digital signal processing system architecture to accomplish this.

Figure 1:
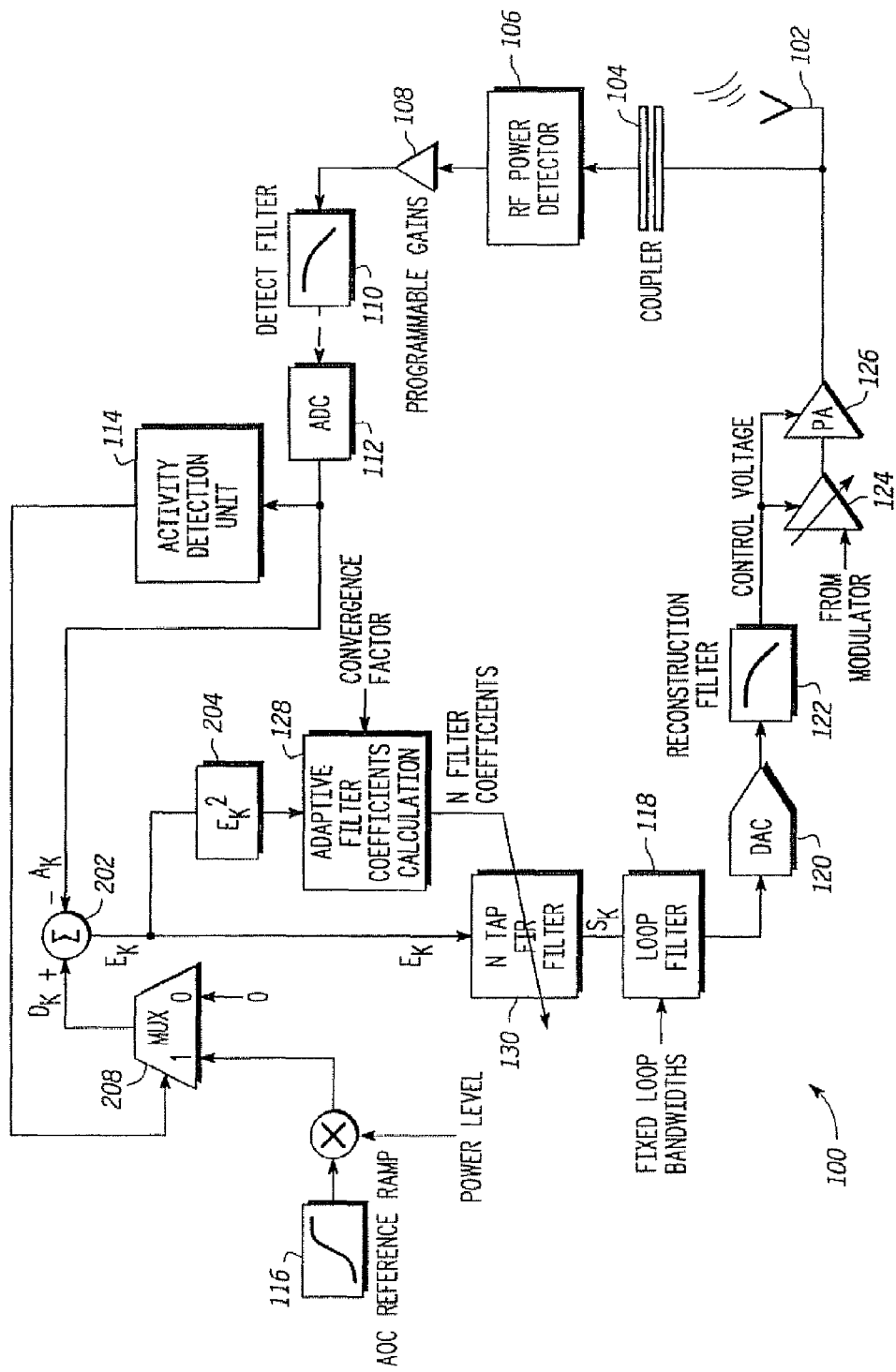
FIG. 1 illustrates a block diagram of a power control system according to an embodiment of the present disclosure.

FIG. 1 illustrates a block diagram of a power control system according to an embodiment of the present disclosure. Power control system 100 includes well known components such as a radio frequency (RF) transmitter 102, a coupler 104, an RF power detector 106, a programmable gain circuit 108, a detect filter 110, an analog to digital converter (ADC) 112, digital activity detection unit 114, reference ramp look up table 116 whose output is multiplied by the target final power level, loop filter 118, power control digital to analog converter (DAC) 120, reconstruction filter 122, analog gain control stage 124, and power amplifier 126. These devices and their operations are well known in the art. Any deviations from conventional operation are only as noted herein. For example, according to an embodiment of the present disclosure, loop filter 118 receives fixed loop bandwidths.

Power control system 100 also includes an error squaring block 204, an adaptive filter coefficients calculation unit 128 and an N-tap adaptive filter 130. The number of the taps of adaptive filter 130 can be programmable. In operation, the coefficients of adaptive filter 130 are adjusted based on the difference between a reference ramp $D_k$ and feedback signal $A_k$. The N tap adaptive DSP system is configured to track any gain/slope variations in the analog feedforward and feedback paths of the power control system. It will be appreciated that the error squaring block 204 may be considered part of the filter coefficients calculation unit 128.

Figure 2:
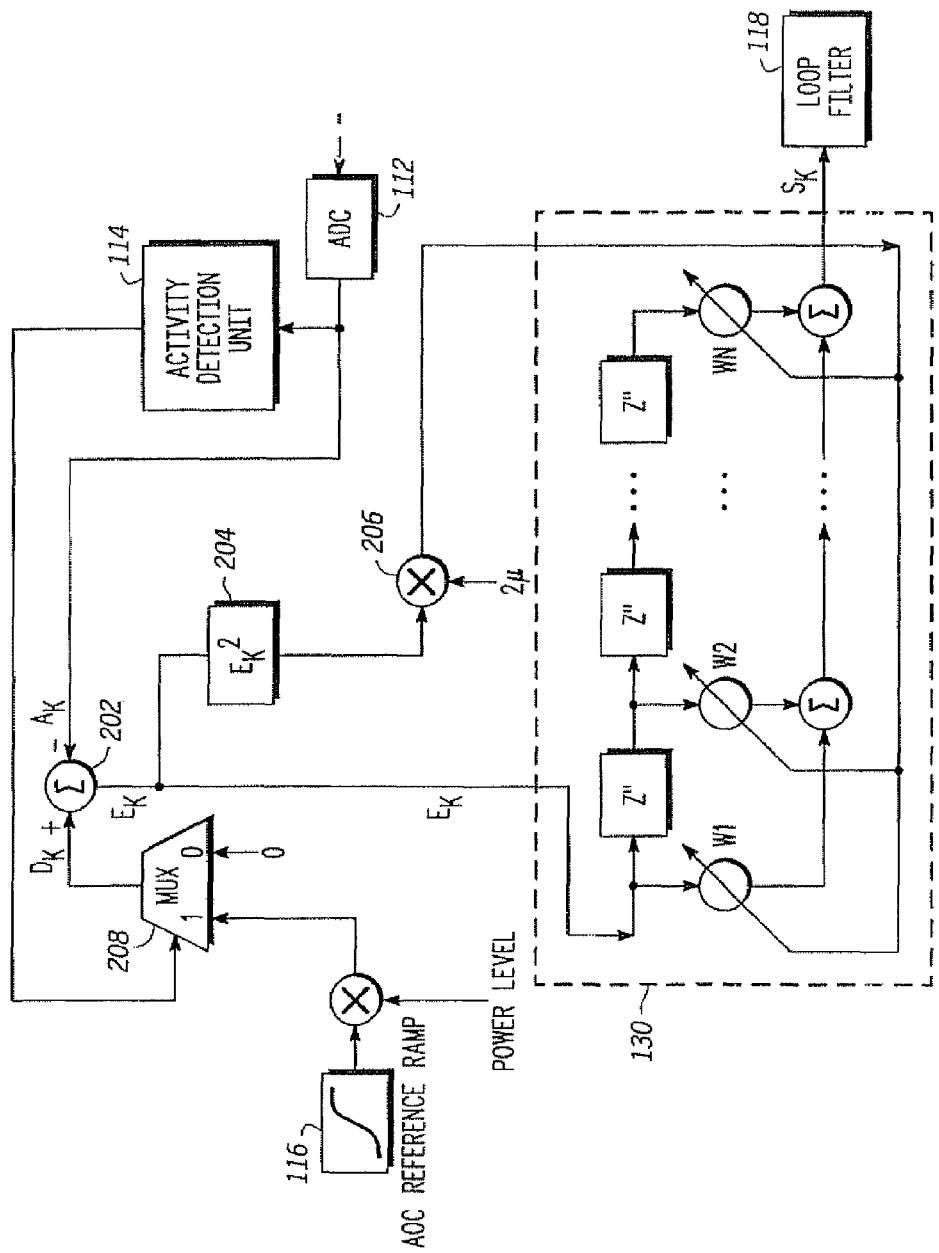
FIG. 2 illustrates a detailed block diagram of a portion of a power control system according to an embodiment of the present disclosure.

FIG. 2 illustrates a more detailed block diagram of a portion of a power control system according to an embodiment of the present disclosure. $D_k$ is the desired input signal, and $A_k$ is the signal that has to ideally track $D_k$ irrespective of any gain/slope variations in the analog feedforward and feedback paths. The difference between them $E_k = D_k - A_k$ is used to adjust the taps of adaptive filter 130 by employing an adaptive technique, such as a least mean square (LMS) adaptive algorithm. The output of the adaptive filter $S_k$ converges to zero following closed loop adaptation, thus forcing the loop to settle to a desired steady state target power level.

The algorithm is described for an N=2 tap example, though it will be appreciated that other numbers of taps can be used. An initial weight vector $W_0=[w_{10}\ w_{20}]^T$ is assumed. The difference $E_k=D_k-A_k$ is calculated by summation unit 202 on a sample-by-sample basis. The error signal $E_k$ is then squared by square unit 204 and used to adapt the filter taps of adaptive filter 130 as illustrated in FIG. 2 and as described by the following equations. For the iteration k, the output of adaptive filter 130, $S_k=E_k w_{1k}+E_{k-1}w_{2k}$, is calculated. The weights are then updated according to the LMS algorithm, $W_{k+1}=W_{k+2\mu E k}^2$ by summation unit 206. The initial weight vectors and the initial input vectors $E_k$'s are assumed to be zero. The convergence factor $\mu$ determines the stability and the speed of convergence. The output of adaptive filter 130 feeds loop filter 1118. According to an embodiment of the present disclosure, loop bandwidths are set close to an optimal setting and the adaptive algorithm adjusts for any gain/slope variations with the control loop to meet power control specifications. The Equations 1 to 5 summarize a specific embodiment of the adaptation process.

$$E_k=D_k-A_k \quad \text{(Equation 1)}$$

$$W_k=[w_{1k}\ w_{2k}] \quad \text{(Equation 2)}$$

$$S_k=E_k w_{1k}+E_{k-1}w_{2k} \quad \text{(Equation 3)}$$

$$\text{(Equation 4)}=\lfloor E_k\ E_{k-1}\rfloor\begin{bmatrix}w_{1k}\\w_{2k}\end{bmatrix}$$

$$W_{k+1}=W_{k+2\mu E_k^2} \quad \text{(Equation 5)}$$

Figure 3:
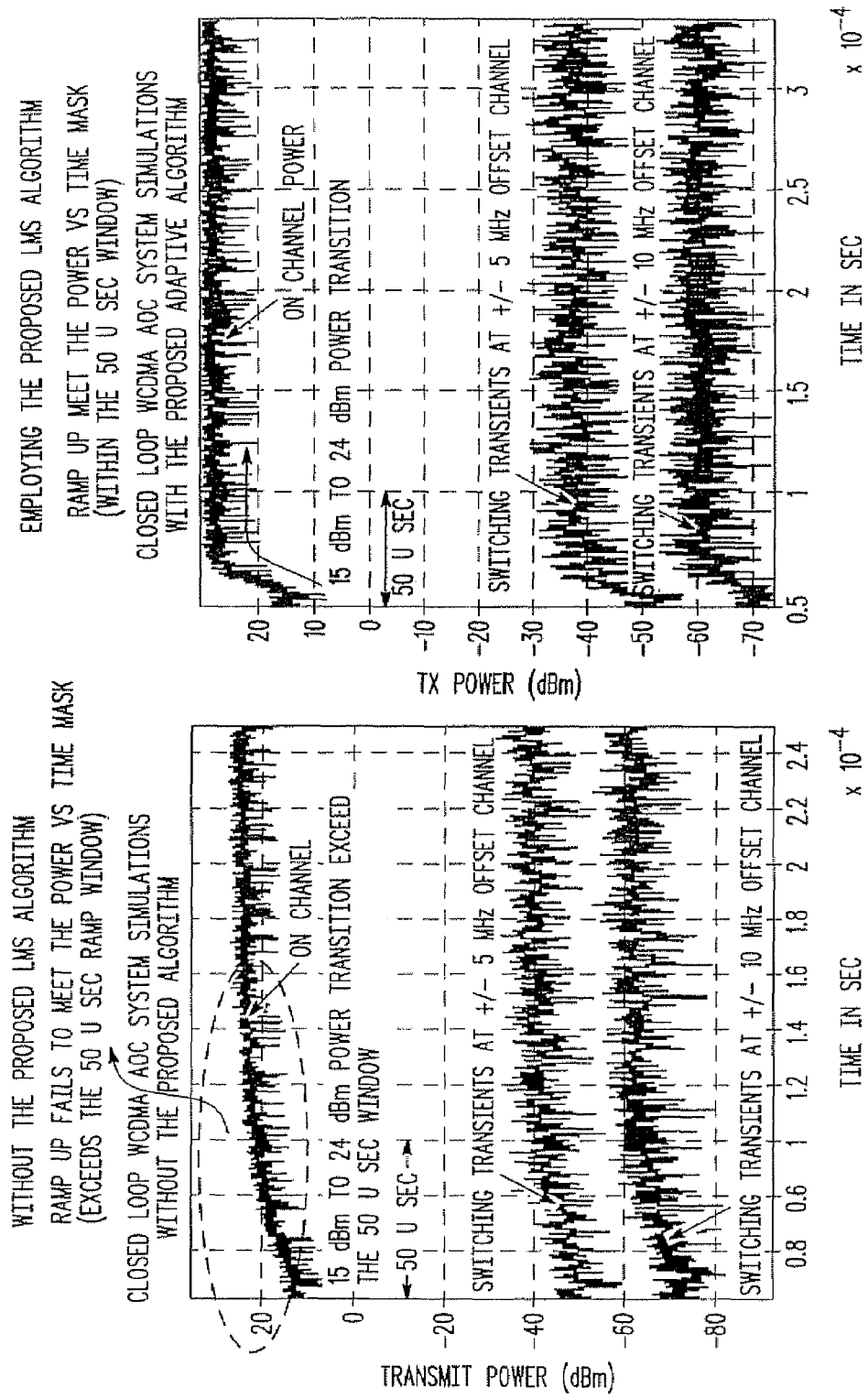
FIG. 3 illustrates a transmit power vs. time plot for a closed-loop WCDMA system according to an embodiment of the present disclosure
Figure 4:
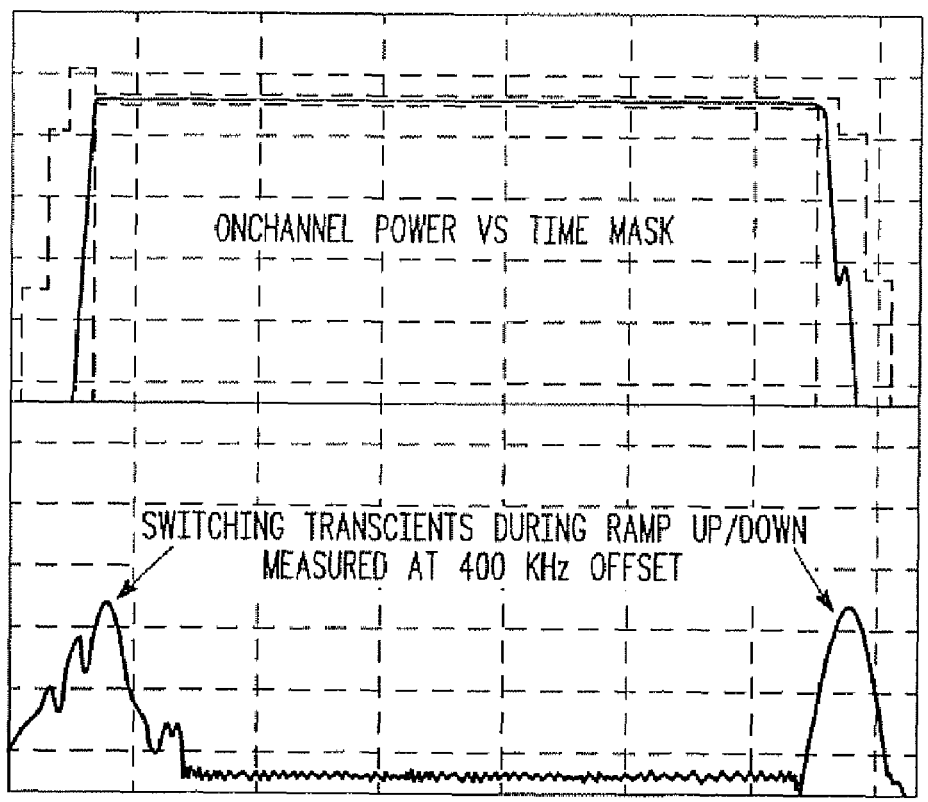
FIG. 4 illustrates a power vs. time mask curve and the switching transients during a transmit power ramp up and ramp down of a GSM burst according to an embodiment of the present disclosure.

Both plots in FIG. 3 show a power up change from 15 dBm to 24 dBm at the antenna. Both plots in this figure show the Power versus Time response for the on-channel signal as well as that at the adjacent channel (5 MHz offset), and alternate channel (10 MHz offset). The plot on the left shows these responses without using the proposed adaptive signal processing scheme whereas the one on the right shows these responses using the proposed adaptive signal processing scheme. In the plot on the left, the power control system fails to meet the 50 us required settling time for the on-channel power by employing a fixed loop bandwidth programmed in the loop filter without using the proposed adaptive signal processing technique. Alternately, in the plot on the right, by employing the proposed adaptive signal processing scheme we are able to meet the 50 us settling time for the on-channel signal with a fixed loop bandwidth. FIG. 4 illustrates the power versus time mask during a transmit power ramp up and ramp down of a GSM-FracN burst according to an embodiment of the present disclosure. The power control system compensates for the inappropriate settings of the loop bandwidths (−22 dB instead of −11 dB). For the same power level of operation (26 dBm), the loop bandwidths do not need to be modified to a different value in order to meet the Power vs. Time Mask and the switching transient specifications.

Simulations indicate that the adaptive algorithm according to an embodiment of the present disclosure can compensate for up to +/−11 dB variations in the closed loop system gain using a fixed convergence factor to meet the desired power versus time and transient power specifications. The algorithm converges nominally without causing any additional switching transients.

By employing the disclosed system, the need for factory calibration of the closed loop parameters for each band and for each input power levels of the PA can be eliminated, thus saving time and money. In addition, power amplifier droop compensation circuits can be eliminated because the filter taps are adjusted sample by sample and track the reference ramp and thus compensate for any power amplifier droops in the analog RF transmit path. Further, the since the closed loop system is more tolerant to gain variations in the feedforward and feedback paths, it provides a more stable and robust control system.

Although the embodiments disclosed in the figures describe the use of a power amplifier, those skilled in the art will recognize that the disclosed closed loop DSP algorithm can control an arbitrary analog gain control stage. The arbitrary analog gain control stage can be a baseband amplifier. Alternatively, the arbitrary analog gain control stage can be an RF amplifier where the RF amplifier is a voltage controlled amplifier or a power amplifier.

The above-disclosed subject matter is to be considered illustrative, and not restrictive, and the appended claims are intended to cover all such modifications, enhancements, and other embodiments that fall within the intention and scope of the present invention. Thus, to the maximum extent allowed by law, the scope of the present invention is to be determined by the broadest permissible interpretation of the following claims and their equivalents, and shall not be restricted or limited by the foregoing detailed description. For example, another adaptive algorithm like the recursive least squares (RLS) technique could be adopted.

What is claimed is:

1. A power control system comprising:
   a gain control stage configured to amplify an input signal to produce an amplified signal;
   a power detector coupled to an output of the gain control stage, the power detector to detect a ramp of the amplified signal and to provide an indication of the ramp; and
   a controller coupled to the power detector and the gain control stage, the controller configured to adjust a supply or control voltage to the gain control stage responsive to the indication of the ramp to cause the supply or control voltage to change as the ramp varies from a predetermined ramp, wherein the predetermined ramp comprises a desired waveform curve modified by a required power level the controller comprising: an error squaring unit; an adaptive filter coefficients calculation unit; and a adaptive filter having multiple taps coupled to the adaptive filter coefficient calculation unit; wherein the ramp of the amplified signal is compared to the predetermined ramp producing an error term; wherein the adaptive filter coefficient calculation unit uses the error term to calculate and adjust one or more of the multiple taps of the adaptive filter; wherein an output of the adaptive filter is fed into a loop filter that accumulates the output signal.

2. The power control system, as recited in claim 1, wherein the required power level comprises a power versus time mask and the desired waveform curve is a raised cosine wave.

3. The power control system, as recited in claim 1, wherein the required power level comprises a mask according to a predefined power versus time specification and a transient power specification.

4. The power control system, as recited in claim 1, wherein the voltage is one of a supply voltage and a control voltage.

5. The power control system, as recited in claim 1, wherein the predetermined ramp is independent of operating conditions of the power control system.

6. The power control system, as recited in claim 5, wherein the operating conditions comprise a power input level to an amplifier stage, temperature, frequency band of operation, and a battery voltage level.

7. The power control system, as recited in claim 1, wherein the adaptive filter coefficients calculation unit utilizes a least mean square (LMS) adaptive algorithm.

8. The power control system, as recited in claim 1, wherein the adaptive filter coefficients calculation unit utilizes a recursive least squares algorithm.

9. The power control system, as recited in claim 1, wherein the output of the adaptive filter converges to zero.

10. The power control system, as recited in claim 1, wherein an output of the filter is given by the equation $E_K W_{1K} + E_{K-1} W_{2K}; + \ldots + E_0 W_{NK}$ where N is an integer representing the length of the filter;
wherein $W_{K+1}$ is $W_K + 2\mu E_K^2$;
wherein $\mu$ is a convergence term;
wherein $W_K$ is initially 0; and
wherein $E_K$ is the error term.

11. The power control system, as recited in claim 1, further comprising:
an activity detection circuit for producing an activity output indicating a detection of activity; wherein the activity output selects between a null signal when activity is not detected and the predetermined ramp when activity is detected to compare with the ramp of the amplified signal.

12. The power control system, as recited in claim 1, further comprising a voltage control circuit coupled between the controller and the gain control stage, wherein the controller produces a control signal responsive to the error term; the voltage control circuit processing the control signal to produce the supply voltage.

13. The power control system, as recited in claim 1, further comprising:
a loop filter coupled to the output of the controller for filtering an output of the controller using a fixed loop bandwidth, wherein the fixed loop bandwidth is independent of operating conditions, the operating conditions including variations of analog circuit elements over temperature, supply voltage, frequency band of operation.

14. The power control system, as recited in claim 1, wherein the controller controls a ramp up of the amplified signal.

15. The power control system, as recited in claim 1, wherein the controller controls a ramp down of the amplified signal.

16. A method of amplifying a radio frequency (RF) signal, the method comprising:
amplifying the RF signal with a gain control stage to produce an amplified signal;
detecting a ramp of the amplified signal;
comparing the ramp of the amplified signal to a predetermined ramp producing an error difference, wherein the predetermined ramp comprises a desired waveform curve modified by a required power level;
dynamically adjusting multiple taps of an adaptive filter based on the error difference signal producing a control signal;
filtering the control signal with a loop filter that has a fixed loop bandwidth producing a filtered control signal; and
controlling a control voltage of the gain control stage based on the filtered control signal.

17. The method, as recited in claim 16, wherein the required power level comprises a power versus time mask and the desired waveform curve comprises a raised cosine wave.

18. The method, as recited in claim 16, wherein the required power level comprises a mask according to a predefined power versus time specification and a transient power specification.

19. The method, as recited in claim 16, wherein the predetermined ramp is independent of operating conditions of a power control system.

20. The method, as recited in claim 19, wherein the operating conditions comprise a power input level, temperature, and a battery voltage level.

21. The method, as recited in claim 16, wherein adjusting the multiple taps of the adaptive filter is according to a least mean square (LMS) adaptive algorithm.

22. The method, as recited in claim 16, wherein adjusting the multiple taps of the adaptive filter is according to a recursive least squares algorithm.

23. The method, as recited in claim 16, wherein the control signal converges to zero.

24. The method, as recited in claim 16, wherein an output of the adaptive filter is given by the equation $E_K W_{1K} + E_{K-1} W_{2K}; + \ldots + E_0 W_{NK}$ where N is an integer representing the length of the filter;
wherein $W_{K+1}$ is $W_K + 2\mu E_K^2$;
wherein $\mu$ is a convergence term;
wherein $W_K$ is initially 0; and
wherein $E_K$ is the error difference.

25. The method, as recited in claim 16, further comprising:
detecting activity of the amplified signal and producing an activity output;
wherein the output is configured to select between a null signal when activity is not detected and the predetermined ramp when activity is detected to compare with the ramp of the amplified signal.

26. The method, as recited in claim 16, further comprising:
filtering the control signal using a loop filter with a fixed loop bandwidth,
wherein the fixed loop bandwidth is independent of operating conditions of a power control system.

27. The method, as recited in claim 26, wherein the operating conditions comprise a power input level, temperature, frequency band of operation, and a battery voltage level.

28. The method, as recited in claim 16, wherein the controlling the control voltage controls a ramp up of the amplified signal.

29. The method, as recited in claim 16, wherein the controlling the control voltage controls a ramp down of the amplified signal.

* * * * *